(12) United States Patent
Dubois et al.

(10) Patent No.: US 9,742,274 B2
(45) Date of Patent: Aug. 22, 2017

(54) DC-DC HIGH VOLTAGE CONVERTER

(71) Applicants: LABINAL POWER SYSTEMS, Blagnac (FR); CENTRE NATIONAL DE LA RECHERCHE SCIENTIFIQUE, Paris (FR)

(72) Inventors: Fabien Dubois, Enghien les Bains (FR); Dominique Bergogne, Saint-Didier-en-Velay (FR)

(73) Assignees: LABINAL POWER SYSTEMS, Blagnac (FR); Centre National De La Recherche Scientifique, Paris (FR)

( * ) Notice: Subject to any disclaimer, the term of this patent is extended or adjusted under 35 U.S.C. 154(b) by 0 days.

(21) Appl. No.: 14/647,525

(22) PCT Filed: Nov. 26, 2013

(86) PCT No.: PCT/FR2013/052862
§ 371 (c)(1),
(2) Date: May 27, 2015

(87) PCT Pub. No.: WO2014/083274
PCT Pub. Date: Jun. 5, 2014

(65) Prior Publication Data
US 2015/0311796 A1    Oct. 29, 2015

(30) Foreign Application Priority Data
Nov. 27, 2012    (FR) ..................... 12 61313

(51) Int. Cl.
*H02M 3/158*    (2006.01)
*H02M 1/08*    (2006.01)
(Continued)

(52) U.S. Cl.
CPC ............. *H02M 3/158* (2013.01); *H02M 1/08* (2013.01); *H02M 3/33507* (2013.01);
(Continued)

(58) Field of Classification Search
CPC ........ H02M 1/08; H02M 3/155; H02M 3/158; H02M 3/33507; H02M 3/33523;
(Continued)

(56) References Cited

U.S. PATENT DOCUMENTS

| 7,812,578 B2 * | 10/2010 | Sugahara | H02M 3/158 323/224 |
| 8,648,577 B2 * | 2/2014 | Usui | H02M 3/155 323/225 |

(Continued)

FOREIGN PATENT DOCUMENTS

| DE | 201 09 957 | 7/2002 |
| DE | 10 2006 017 242 | 11/2006 |

OTHER PUBLICATIONS

International Search Report Issued Aug. 4, 2014 in PCT/FR13/052862 Filed Nov. 26, 2013.

(Continued)

*Primary Examiner* — Matthew Nguyen
(74) *Attorney, Agent, or Firm* — Oblon, McClelland, Maier & Neustadt, L.L.P.

(57) ABSTRACT

A DC-DC voltage converter including a main switch formed by a normally ON switch element connected in series with a normally OFF switch element including a control circuit, a load in series with the main switch, the main switch and the load being configured to be connected to terminals of a DC voltage source. A voltage source, that can be used for controlling is obtained by connecting a main peak detector circuit to the mid-point of the main switch. The control circuit of the normally OFF switch element can be supplied with the DC voltage that makes the entire device self-supplied. Such a converter can, for example, find application in aeronautics.

9 Claims, 4 Drawing Sheets

(51) Int. Cl.
   *H03K 17/10*      (2006.01)
   *H03K 17/567*     (2006.01)
   *H03K 17/0814*    (2006.01)
   *H02M 3/155*      (2006.01)
   *H02M 3/335*      (2006.01)
   *H02M 1/00*       (2006.01)

(52) U.S. Cl.
   CPC ..... *H03K 17/08148* (2013.01); *H03K 17/107* (2013.01); *H03K 17/567* (2013.01); *H02M 3/155* (2013.01); *H02M 3/33523* (2013.01); *H02M 2001/0006* (2013.01)

(58) Field of Classification Search
   CPC .... H02M 2001/0006; H03K 17/08148; H03K 17/107; H03K 17/567; H03K 17/158
   See application file for complete search history.

(56) References Cited

U.S. PATENT DOCUMENTS

| | | |
|---|---|---|
| 2004/0174719 A1 | 9/2004 | Link |
| 2006/0279351 A1 | 12/2006 | Salato et al. |
| 2011/0181252 A1 | 7/2011 | Salato et al. |
| 2015/0002125 A1* | 1/2015 | Kinoshita ............. H02M 3/158 323/285 |
| 2015/0357917 A1* | 12/2015 | Okamatsu ............... H02M 1/08 323/271 |

OTHER PUBLICATIONS

French Search Report Issued Oct. 8, 2013 in Application No. FR 1261313 filed Nov. 27, 2012.

\* cited by examiner

DC-DC HIGH VOLTAGE CONVERTER

TECHNICAL FIELD

The present invention relates to a DC-DC voltage converter for being supplied with a DC voltage source having a large dynamic range in voltage.

STATE OF PRIOR ART

In aeronautic applications in particular, the DC voltage source is a HVDC bus and the voltage can assume values between 650 V and 750 V in a steady state, for example. But the start is made under a low voltage in the order of a few volts to about ten volts. Safety requirements impose that the device using the DC voltage does not have a dysfunction upon powering ON, powering OFF or even during transient voltage periods.

The user device connected to the voltage source can be an inverter. For high voltages and for operations at a high temperature in the order of 200° C., one has been led to use, in this inverter, silicon carbide switch components as JFET transistors which are normally ON components, that is conducting in the absence of a bias voltage.

Quite often, the JFET switch of the inverter is connected to a starting circuit connected in series between the supply voltage and its gate as described in patent application FR 2 937 811, the starting circuit has two stages and includes a linear buck regulator and a voltage inverter, this connection being used for the purpose of protecting the normally ON JFET switch during the loss of the control voltages of the switch.

One drawback of this solution is that it is dissipative which can generate thermal problems by power dissipation at the buck regulator. This becomes critical for high temperatures.

In another single stage starting circuit comprising a converter which transforms a DC voltage into another negative DC voltage, with a Zener diode in series with a resistor, the power dissipation is lower if the resistor has a very high resistance value. For example, for a bus voltage of 750 V and a dissipated power in the Zener diode of 50 mW at 200° C., the series resistance is 76 kΩ.

For operations with a bus voltage being reduced with respect to the rated value, for example in the order of about a hundred volts, the high resistance does not enable the Zener diode to be biased any longer. In this case, the minimum starting voltage is higher than that obtained with the buck regulator and the voltage inverter.

Furthermore, the response time of the starting circuit is increased, since the time constant formed by the series resistor and an unavoidable decoupling capacitor is large, in the order of about ten milliseconds. In practice, it would be desirable that this response time should be very low, for example lower than about one hundred microseconds.

DISCLOSURE OF THE INVENTION

The purpose of the present invention is to provide a DC-DC voltage converter which can be used for controlling JFET transistors, in particular in inverters, which do not have the above restrictions and difficulties.

One purpose of the invention is to provide a DC-DC voltage converter which bears being supplied with a voltage source having a very large dynamic range in voltage. The very large dynamic range in voltage means that the ratio of the minimum voltage applied to its input to deliver a desired output voltage to the maximum input voltage it can bear without deterioration is higher than two, for example 100.

Moreover, the DC-DC voltage converter does not dissipate much heat, which avoids the above discussed thermal problems.

Another purpose of the invention is to provide a DC-DC voltage converter which is capable of delivering an output voltage to a user circuit from a DC voltage likely to vary between a few volts and several hundreds volts or even one or several kilovolts, for example during power ON transients, start up . . . .

Another purpose of the invention is to provide a DC-DC voltage converter which is capable of operating at a high temperature in the order of at least 200° C.

Yet another purpose of the invention is to provide a DC-DC voltage converter which enables normally ON switch semi-conductor components to be protected, in particular in power invertors directly connected to a voltage source or a redistribution bus.

To achieve this purpose, the present invention consists in using a main switch formed by a normally ON switch element and a normally OFF switch element which are connected in series and a main peak detector circuit.

More precisely, the present invention relates to a DC-DC voltage converter including a main switch formed by a normally ON switch element connected in series with a normally OFF switch element equipped with a control circuit. A first node is common to both switch elements. A load is connected in series with the main switch, the main switch and the load being intended to be connected at the terminals of a DC voltage source. A main peak detector circuit is connected at the input to the main switch and at the output to the control circuit of the normally OFF switch element.

The main peak detector circuit advantageously includes a current unidirectional switch in series with an electrical energy reservoir, the current unidirectional switch being connected between the first node and the electrical energy reservoir. It is intended, when closed, to charge the electrical energy reservoir, the electrical energy reservoir delivering a main useful voltage when the current unidirectional switch is open, the main useful voltage being taken in at a second node between the electrical energy reservoir and the current unidirectional switch, this second node being connected to the control circuit of the normally OFF switch element.

The current unidirectional switch can be a diode or a transistor or an arrangement of several transistors in series or in parallel. The current unidirectional switch is connected to the first common node between the normally ON switch element and the normally OFF switch element forming the main switch.

The electrical energy reservoir can be a capacitor or a battery or a supercapacitor.

The normally ON switch element is intended to be connected to one of the terminals of the voltage source via the load, the normally OFF switch element being intended to be connected to the other terminal of the voltage source, both switch elements having a common node.

In one embodiment, the main peak detector circuit can be connected in parallel with the normally OFF switch element.

The normally ON switch element can be an enhancement mode transistor such as a silicon carbide JFET, a normally OFF transistor controlled so as to operate as a normally ON transistor, a current limiter having an inhibition input driven by an auxiliary voltage such as the output voltage or the voltage at the terminals of the normally OFF switch element.

The normally OFF switch element can be a MOSFET, an IGBT, a bipolar junction transistor, for example of silicon carbide or any other switch type with or without a semiconductor.

The load can be resistive or inductive.

The main useful voltage can be the output voltage of the DC-DC voltage converter.

In one embodiment enabling an output voltage isolated from the DC voltage source to be obtained, the load is a transformer with a primary winding and at least one secondary winding.

In this embodiment, the main peak detector circuit can further include a further current unidirectional switch connected on the one hand to the node between the electrical energy reservoir and the current unidirectional switch and on the other hand to the secondary winding of the transformer.

The transformer can include at least one secondary winding at the terminals of which a rectifier circuit is connected, an output voltage being taken in at the terminals of the rectifier circuit.

It is possible to provide that the normally ON switch element is equipped with a control circuit connected at the output of the main peak detector circuit, or at one end of the main switch to be connected to the DC voltage source, or when the load is a transformer which includes at least one secondary winding at the terminals of which a rectifier circuit is connected and this rectifier circuit includes an electrical energy reservoir, to a node between the secondary winding and the electrical energy reservoir of the rectifier circuit.

In another embodiment, the normally ON switch element can have a control terminal connected to the second end of the main switch.

BRIEF DESCRIPTION OF THE DRAWINGS

The present invention will be better understood upon reading the description of exemplary embodiments given by way of purely indicating and in no way limiting purposes, with reference to the appended drawings wherein.

Different embodiments of the DC voltage converter should be understood as not being necessarily exclusive of each other.

DETAILED DISCLOSURE OF PARTICULAR EMBODIMENTS

Figure 1:
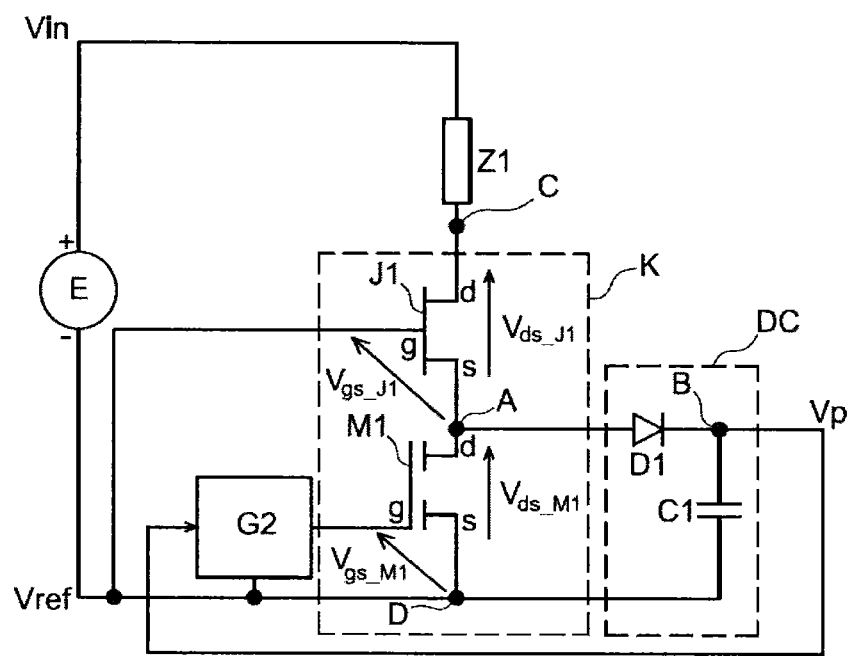
FIG. 1 is a diagram of an exemplary first embodiment of the DC-DC voltage converter object of the invention.

FIG. 1 illustrates a first exemplary DC-DC voltage converter object of the invention. This DC-DC voltage converter is a buck converter.

This converter includes a main switch K having two end terminals C and D intended to be connected to a DC voltage source E, the link to the first terminal C being made via a load Z1 through which flows an electric current from the DC voltage source E. The DC voltage source E includes a positive terminal + to be connected to the load Z1 and a negative terminal − to be connected to the second terminal D of the main switch K. The positive terminal is put to the voltage Vin and the negative terminal is put to a reference voltage Vref.

The main switch K includes two switch elements J1, M1 of different nature connected in series. They are connected to each other at a node A.

The switch element J1 is a normally ON switch whereas the switch element M1 is a normally OFF switch. The normally ON switch element J1 is intended to be connected to the positive terminal of the voltage source E via the load Z1, the normally OFF switch element M1 is intended to be connected to the negative terminal of the voltage source E.

The normally OFF switch element M1 has a control circuit G2 to control its ON or OFF state. The normally OFF switch element J1 can also be provided with its own control circuit G1.

The normally ON switch element J1 is a high voltage switch. The normally OFF switch element M1 can be a low voltage switch.

By high voltage switch element and low voltage switch element, it is meant that the high voltage switch element bears higher voltages than the low voltage switch element.

In the application where the DC voltage source is a HVDC bus, the high voltage switch element J1 nearly bears the voltage of the HVDC bus whereas the low voltage switch element M1 only bears a few tens volts.

The normally ON switch element J1 can be made of an enhancement mode transistor, for example a silicon carbide JFET having conventionally a drain d, a source s and a gate g. Such a transistor has its switching voltage between its drain and its source, Vds_J1, substantially null when its control voltage between its gate and its source, Vgs_J1, is substantially null. Such a JFET type switch element has the advantage of switching very quickly, generating fewer conduction losses in the ON state than other voltage controlled power electronic switches, having a better temperature and voltage withstand strength, and a lower specific resistance than these voltage controlled power electronic switches. The source s is connected to the positive terminal of the electrical supply E via the load Z1, the drain d is connected to the normally OFF switch element M1 and its gate g is connected in this first example to the second terminal D of the main switch K. It is worth considering that the normally ON switch element J1 is equipped with its own control circuit G1 as will be seen subsequently.

Alternatively, the normally ON switch element J1 could be made of a controlled normally OFF transistor so as to operate as a normally ON switch. The normally ON switch element J1 could also be made of a current limiter as described in FIG. 5.

Figure 3:
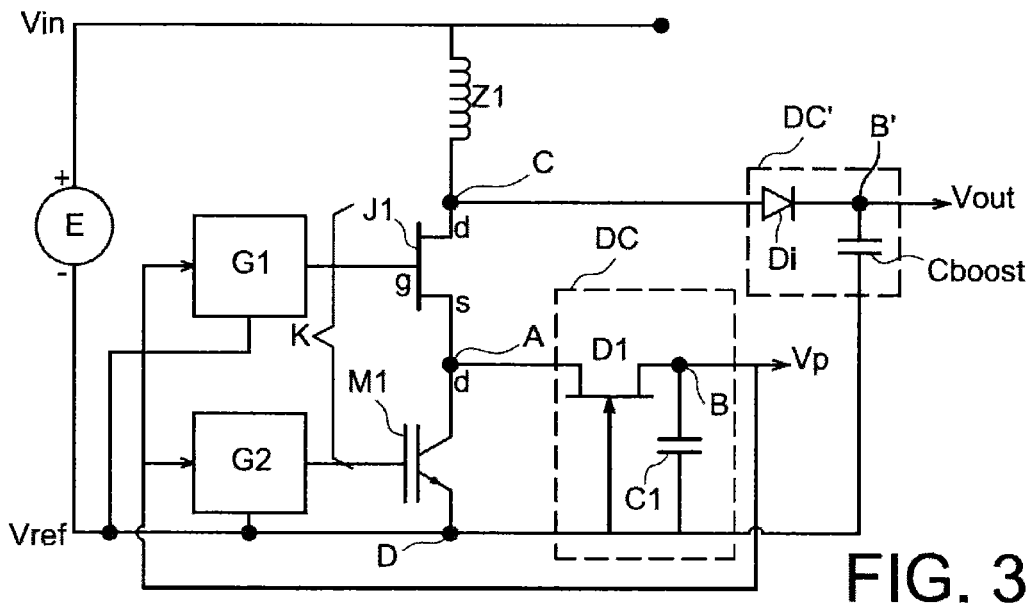
FIG. 3 represents another exemplary embodiment of the DC-DC voltage converter object of the invention.

The normally OFF switch element M1 can be made of a MOSFET transistor, for example of silicon or silicon on insulator SOI. It conventionally has a drain d connected to the normally ON switch element J1, a source s connected to the negative terminal of the DC voltage source E and a gate g connected to its control circuit G2. Alternatively, it could be made of a bipolar junction transistor BJT, for example of silicon carbide, as illustrated in FIG. 3, of an IGBT or any other appropriately controlled switch type with or without a semi-conductor.

The DC-DC voltage converter further includes a main peak detector circuit DC formed by a current unidirectional switch D1 and an electrical energy reservoir C1 both connected in series.

The main peak detector circuit DC is connected in parallel with the normally OFF switch element M1.

The main peak detector circuit DC is thus connected to the second terminal D of the main switch K and to the common node A being common to both switches J1, M1 of the main switch K.

The current unidirectional switch D1 is connected between the node A and the electrical energy reservoir C1. The current unidirectional switch D1 can be made of a diode or by one or several transistors, these transistors being arranged in series or in parallel when there is a plurality of them. In FIG. 3, this is a JFET transistor. The drain of the JFET transistor is connected to the node A, its gate to the second terminal D of the main switch K and its source to the energy reservoir C1. Alternatively, the current unidirectional switch D1 of the peak detector circuit could be made by a bipolar junction transistor BJT, a MOSFET transistor or several MOSFET transistors connected in series or in parallel or any other type of transistors.

In the example of FIG. 1, the electrical energy reservoir C1 is connected between the current unidirectional switch D1 and the second terminal D of the main switch K. The common node between the current unidirectional switch D1 and the electrical energy reservoir C1, called B, is connected at the input of the control circuit G2 of the normally OFF switch element M1. In this example, the output of the DC-DC voltage converter is made at this common node B. The DC voltage delivered by the main peak detector circuit DC has been called main useful voltage Vp, it is provided at the common node B.

The electrical energy reservoir C1 is intended to store electrical energy when the current unidirectional switch D1 is closed and to provide this energy in the form of the main useful voltage Vp, when the current unidirectional switch D1 is open. The electrical energy reservoir C1 can be made of a capacitor, a battery or a supercapacitor.

FIGS. 2A to 2E set out the aspects of the wave forms at different levels of the DC-DC voltage converter object of the invention, this converter being in accordance with that of FIG. 1 with, as a normally ON switch element J1, a JFET transistor and as a normally OFF switch element M1, a MOSFET transistor.

Figure 2A:
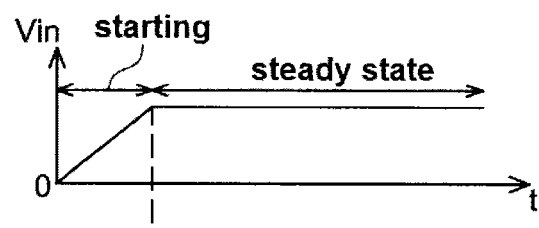
FIGS. 2A to 2E illustrate respectively the evolution over time, of the voltage of the voltage source as soon as it is started, of the control voltage of the normally OFF switch element, of the switching voltage of the normally OFF switch element, of the switching voltage of the normally ON switch element and of the control voltage of the normally ON switch element.

FIG. 2A represents the evolution over time of the input voltage Vin of the DC-DC voltage converter object of the invention. This is the voltage delivered by the DC voltage source E. In aeronautic applications, this will be the voltage provided by a high voltage direct current bus HVDC. Upon powering ON the voltage source, the voltage increases during a starting phase until it reaches, in a steady state, a constant value.

Figure 2B:
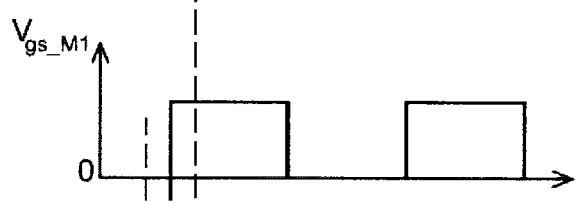

FIG. 2B represents the aspect, over time, of the gate-source control voltage Vgs_M1 of the normally OFF switch element M1.

Figure 2C:
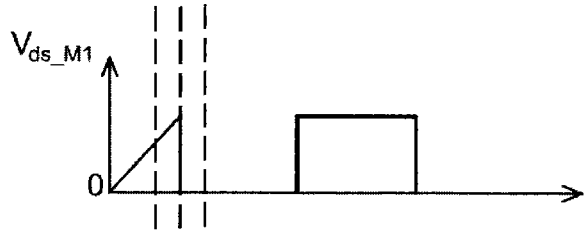

FIG. 2C represents the aspect, over time, of the voltage switched between the drain and the source Vds_M1 of the normally OFF switch element M1.

Figure 2D:
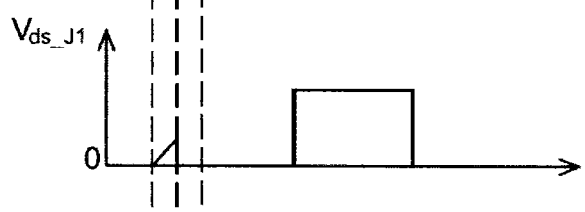

FIG. 2D represents the aspect, over time, of the voltage switched between the drain and the source Vds_J1 of the normally ON switch element J1.

Figure 2E:
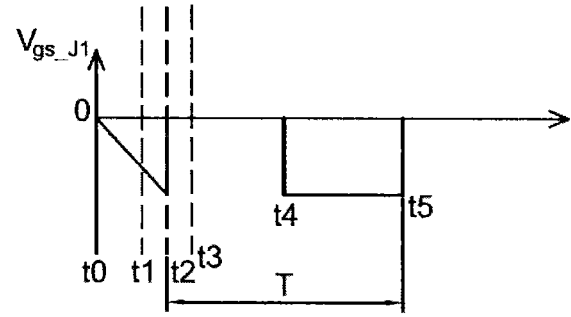

FIG. 2E represents the aspect, over time, of the gate-source control voltage Vgs_J1 of the normally OFF switch element J1.

Upon starting the voltage source E, at the instant t0, the voltage Vin linearly increases until it reaches a maximum value, in the steady state, at the instant t3.

The normally ON switch element J1 is ON, the voltage switched between its drain and its source Vds_J1 is constant and null.

The normally OFF switch element M1 is OFF, the voltage switched between its drain and its source Vds_M1 increases in the same way as the voltage Vin and the current unidirectional switch D1 is conducting, which results in the electrical energy reservoir C1 being filled with the voltage Vds_M1. The main useful voltage Vp, delivered by the main peak detector circuit, supplying the control circuit G2 of the normally OFF switch element M1 increases. Since the source of the normally ON switch element J1 is connected to the drain of the normally OFF transistor M1 at the node A, the gate-source control voltage Vgs_J1 of the normally ON switch element J1 negatively increases, which results, at an instant t1 following the instant t0, in turning OFF the normally ON switch element J1. This instant t1 is prior to instant t3 when the voltage source E switches to the steady state. The voltage switched between its drain and its source Vds_J1 begins to increase in the same way as the voltage Vin but with a delay with respect to the powering ON of the voltage source E.

A sufficient application of the main useful voltage Vp to the control circuit G2, for example in the order of a few volts, for example 2 to 4 V, results in the normally OFF switch element M1 switching to the ON state thanks to the intervention of the control circuit G2 at an instant t2 following the instant t1 but prior to the instant t3.

At this instant t2, the voltage switched between the drain and the source Vds_M1 of the normally OFF switch element M1 gets cancelled, the current unidirectional switch D1 opens and the normally ON switch element J1 goes back ON. The main peak detector circuit DC provides to the control circuit G2 of the normally OFF switch element M1 a main useful voltage Vp necessary for holding it ON.

The electrical energy reservoir C1 empties, but not completely, the voltage variation at the terminals thereof depends on the load to be provided to the control circuit G2. The gate-source control voltage Vgs_M1 of the normally OFF switch element M1 gets cancelled and the normally OFF switch element M1 goes back OFF at an instant t4 which follows the instant t3. In the same time, the normally ON switch element J1 is turned OFF. The drain-source switching voltage Vds_M1 of the normally OFF switch element M1 starts to increase again. The same is true for the drain-source switching voltage Vds_J1 of the normally ON switch element J1.

At this instant t4, the current unidirectional switch D1 closes and the electrical energy reservoir C1 charges at the drain-source switch voltage Vds_M1.

The normally OFF switch element M1 is thus ON between the instants t2 and t4 and then OFF between the instants t4 and t5. This cyclic phenomenon is repeated at each cutting period T of the DC-DC voltage converter.

The main useful voltage Vp produced by the DC-DC voltage converter at the terminals of the electrical energy reservoir C1 is equal to the pinch-off voltage of the normally ON switch element J1.

The mean value of the voltage at the terminals of the load Z1 is equal to the voltage Vin multiplied by the duty factor α of the converter, that is the ratio between the powering ON duration of the normally OFF switch element M1 and the cutting period T of the DC-DC voltage converter. The voltage at the terminals of the load Z1 is a square wave voltage ranging from Vref to the value of the voltage Vin in the steady state.

The DC-DC voltage converter object of the invention thus starts for a very low voltage of the voltage source E, in the order of a few volts, whereas the voltage source E has a dynamic range in voltage in the order of a few hundreds volts or even more.

This starting voltage of the DC-DC voltage converter corresponds to the powering ON threshold of the normally OFF switch element M1 and to the wake up threshold of the control circuit G2 of the normally OFF switch element M1. However, one of the important aspects of the invention is to be capable of obtaining a voltage at the terminals of the electrical energy reservoir C1 as soon as the input voltage Vin is no longer null, that is from the instant when, upon powering ON, the DC bus voltage, E, starts to increase from zero. If the current unidirectional switch D1 is a rectifier device without a threshold, having a normally ON transistor as for example in FIG. 3, the electrical energy reservoir C1 charges exactly as soon as the voltage E is different from zero.

The DC-DC voltage converter object of the invention can be used for example to supply the control circuits of normally ON electronic components of an inverter, but it is not compulsory. More generally, it can supply control circuits, protection circuits or any circuit supplied by a DC supply network.

This converter is suitable for high temperature applications because both switch elements J1, M1 it includes have a high temperature version, as so has the current unidirectional switch D1, as regards the electrical energy reservoir C1, this can be a ceramic capacitor NP0.

In the example illustrated in FIG. 1, the load Z1 can represent parasitic elements. It may be an inductor as illustrated in FIG. 3. The DC-DC voltage converter being represented is then referred to as a boost converter or even a parallel chopper and no longer a buck converter. In this case, the load Z1 is a storage inductor connected to the main switch K at its first terminal C. A rectifier circuit DC' is connected in parallel with the main switch K. It includes a current unidirectional switch Di connected in series with an electrical energy reservoir Cboost. The rectifier circuit DC' is connected, on the side of the current unidirectional switch Di, to the first terminal C of the main switch K and, on the side of the electrical energy reservoir Cboost, to the second terminal D of the main switch K. The current unidirectional switch Di and the electrical energy reservoir Cboost have a common node called B' and an output voltage Vout higher than Vin is available at the node B'.

The inductor could be a leak inductor of a cutting power transformer for example. The normally ON switch element J1 will dissipate the energy stored in the inductor Z1 if this is a JFET transistor and its gate is put to the reference voltage Vref as shown in FIG. 1. The normally ON switch element J1 could operate in avalanche because the branch with the inductor Z1 and the main switch K is opened by the switch elements J1 and M1.

However, this is not the configuration illustrated in FIG. 3. The normally ON switch element J1 is connected to its own control circuit G1 and the latter is supplied with the main useful voltage Vp delivered by the main peak detector circuit DC. Thus, the gate-source control voltage of the normally ON switch element J1 is higher than its threshold voltage.

The electrical energy reservoir C1 will be charged then from the energy stored by the inductor Z1, when the normally ON switch element J1 is ON and the normally OFF switch element M1 is OFF.

The current unidirectional switch D1 could be made by at least one MOSFET transistor, used for example in synchronous rectification. The control circuit G2 of the normally OFF switch element M1 could then integrate a variable pulse width signal generator. The control circuit G1 of the normally ON switch element J1 could integrate a voltage inverter if it is desired to turn OFF the normally ON switch element J1.

Figure 4:
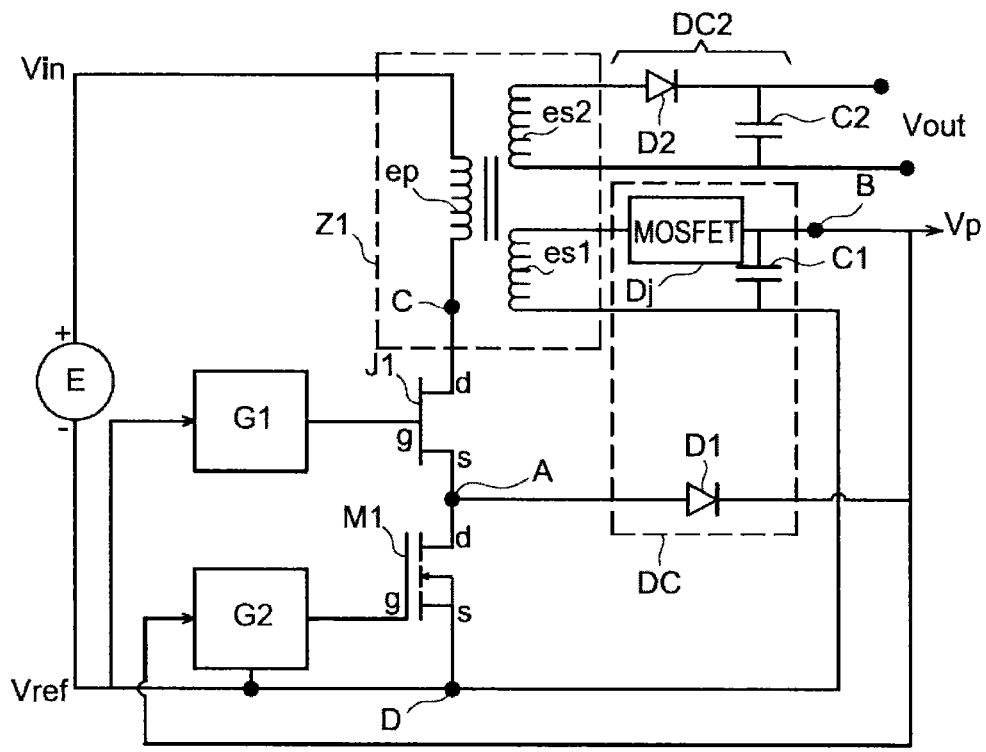
FIG. 4 illustrates another exemplary embodiment of the DC-DC voltage converter object of the invention.

FIG. 4 illustrates another example of a DC-DC voltage converter object of the invention. Now, the load Z1 is a transformer and the latter conventionally includes a primary winding ep connected between the positive terminal of the DC voltage source E and the node C. It also includes at least one secondary winding es1. The main peak detector circuit DC includes the current unidirectional switch element D1 in series with the electrical energy reservoir C1, it is connected as in both previous examples illustrated in FIGS. 1 and 3. But the main peak detector circuit DC further includes a further current unidirectional switch Dj connected on the one hand to the node B between the electrical energy reservoir C1 and the current unidirectional switch D1 and on the other hand to a first end of a secondary winding es1 of the transformer Z1. The other end of the secondary winding es1 is connected to the second terminal D of the main switch K. The further current unidirectional switch Dj can be of the same type as the current unidirectional switch D1. The current unidirectional switch D1 ensures the start of the control circuit G2 of the normally OFF switch element M1, the voltage Vin being still low and increasing. Then, the current unidirectional switch D1 is turned OFF and the secondary winding es1, the further current unidirectional switch Dj then ensure the supply of the control circuit G2 of the normally OFF switch element M1.

The control circuit G1 of the normally ON switch element J1 is connected to the voltage Vref, that is to the second terminal D of the main switch K to be connected to the DC voltage source E.

This connection enables the efficiency to be increased by using a cutting system and the start is made for lower voltages than in the previous examples. It allows a start of the converter for a very low input voltage.

If the switch element J1 is a JFET transistor, it will never operate in a linear zone and the power dissipation will be reduced.

In the example of FIG. 4, the transformer Z1 further includes a further secondary winding es2. A rectifier circuit DC2 is connected to the terminals of the further secondary winding es2. This rectifier circuit DC2 delivers an output DC voltage Vout which is galvanically isolated from the voltage source E.

The rectifier circuit DC2 can be of the same type as the main peak detector circuit DC of the examples described in FIGS. 1 and 3. The rectifier circuit DC2 is formed by a current unidirectional switch D2, an electrical energy reservoir C2 which are connected in series. Other further secondary windings and several other rectifier circuits could have been provided in order to take advantage of several other output DC voltages galvanically isolated from the voltage source E.

For the sake of simplification, the potential Vp and the main useful voltage Vp have been called the same, which suggests that Vref is null. Of course, Vref can be not null, but this does not raise any problem of understanding to those skilled in the art.

The circuit represented in FIG. 4 results in starting the DC-DC voltage converter under a lower voltage Vin.

Figure 5:
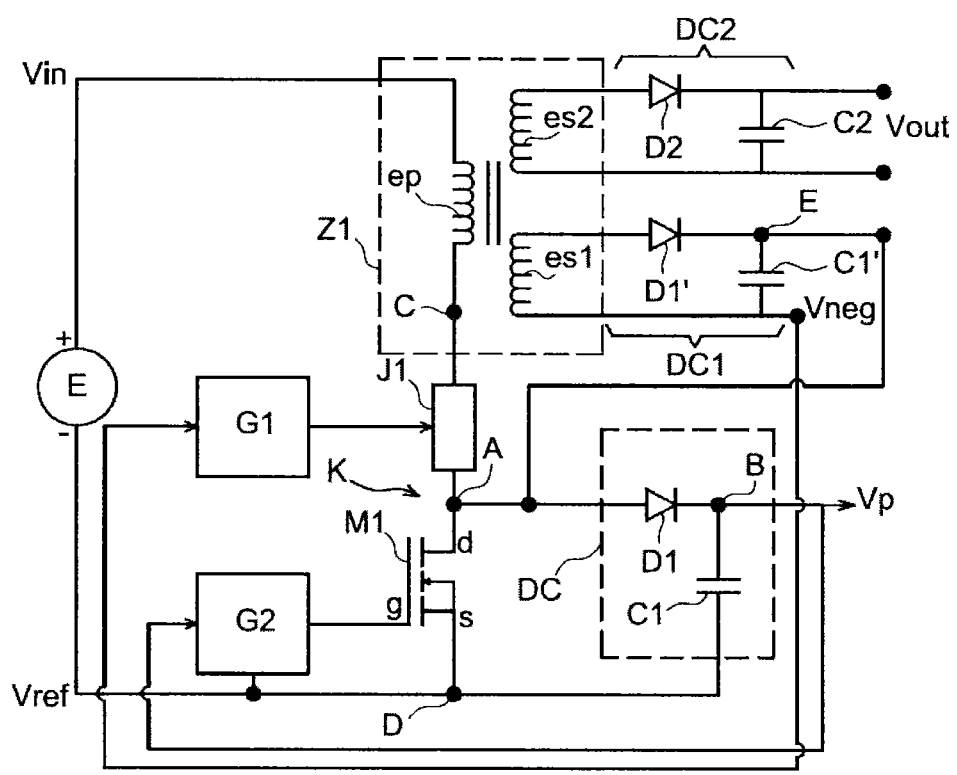
FIG. 5 illustrates yet another exemplary embodiment of the DC-DC voltage converter object of the invention.

FIG. 5 illustrates yet another example of a DC-DC converter object of the invention. In this FIG. 5, the load is still a transformer with two secondary elements es1, es2. Each of them is connected to a rectifier circuit DC1, DC2. In this example, these rectifier circuits DC1, DC2 are similar to that referred to as DC2 in FIG. 4. The current unidirectional switch of the rectifier circuit DC1 is referred to as D1' and the electrical energy reservoir is referred to as C1'.

The common node between the current unidirectional switch D1' and the electrical energy reservoir C1' of the rectifier circuit DC1 is referred to as E, it is connected to the common node A between the normally ON switch element J1 and the normally OFF switch element M1 of the main switch K. The electrical energy reservoir C1' has one of its terminals connected to the node E and the other connected at the input of the control circuit G1 of the normally ON switch element J1. This other terminal is put to a potential Vneg which is negative with respect to the potential present at the common node A between the normally ON switch element J1 and the normally OFF switch element M1.

In this example, the main peak detector circuit DC is similar to that illustrated in FIGS. 1 and 3. The output of the main peak detector circuit DC supplies the control circuit G2 of the normally OFF switch element M1. The voltage Vp is positive with respect to Vref.

Moreover, the normally ON switch element J1 is a current limiter having an inhibition input driven by Vneg.

As described in FIG. 4, the rectifier circuit DC2 delivers an output DC voltage Vout which is galvanically isolated from the voltage source E. This voltage Vout can supply an external circuit (not represented), for example a circuit for controlling the gate of a power transistor JFET.

The main advantage of the DC-DC voltage converter of the invention is to have a linear operation for very low voltages of the voltage source and an operation through cutting for high voltages. This leads to a reduced power consumption and thus to a reduced thermal dissipation.

Another advantage of the DC-DC voltage converter is that it includes fewer high voltage passive components than the starting circuit described in the above mentioned patent application.

Of course, some characteristics represented in these examples of embodiments of the DC-DC voltage converter can be combined with each other without departing from the scope of the invention.

The invention claimed is:

1. A DC-DC converter comprising:
a main switch including a normally ON switch element connected in series with a normally OFF switch element including a control circuit;
a first node being common to both switch elements;
a load including a transformer, with a primary winding and at least one secondary winding, the primary winding being in series with the main switch, the main switch and the primary winding being configured to be connected to terminals of a DC voltage source; and
a main peak detector circuit connected at an input to the main switch and at an output to the control circuit of the normally OFF switch element,
wherein the main peak detector circuit includes a first current unidirectional switch in series with an electrical energy reservoir, the first current unidirectional switch being connected between the first node and the electrical energy reservoir, the first current unidirectional switch being configured, when closed, to charge the electrical energy reservoir,
the electrical energy reservoir delivering a main useful voltage when the first current unidirectional switch is open, the main useful voltage being taken in at a second node between the electrical energy reservoir and the first current unidirectional switch, the second node being connected to an input of the control circuit of the normally OFF switch element, and
the main peak detector circuit includes a second current unidirectional switch connected to the second node between the electrical energy reservoir and the first current unidirectional switch, and to the at least one secondary winding.

2. The DC-DC voltage converter according to claim 1, wherein the first current unidirectional switch is a diode or a transistor or an arrangement of plural transistors in series or in parallel.

3. The DC-DC voltage converter according to claim 1, wherein the electrical energy reservoir is a capacitor or a battery or a supercapacitor.

4. The DC-DC voltage converter according to claim 1, wherein the main peak detector circuit is connected in parallel with the normally OFF switch element.

5. The DC-DC voltage converter according to claim 1, wherein the normally ON switch element is an enhancement mode transistor or a normally OFF transistor controlled to operate as a normally ON transistor or a current limiter.

6. The DC-DC voltage converter according to claim 1, wherein the normally OFF switch element is a MOSFET or an IGBT or a bipolar junction transistor.

7. The DC-DC voltage converter according to claim 1, wherein the transformer includes the at least one secondary winding at terminals of which a rectifier circuit is connected.

8. The DC-DC voltage converter according to claim 1, wherein the normally ON switch element includes a control circuit connected at one end of the main switch to be connected to the DC voltage source.

9. The DC-DC voltage converter according to claim 1, wherein the main switch includes a first end connected to the load and a second end to be connected to the DC voltage source, the normally ON switch element including a control terminal connected to the second end of the main switch.

* * * * *